US007070427B2

(12) United States Patent
Liao et al.

(10) Patent No.: US 7,070,427 B2
(45) Date of Patent: Jul. 4, 2006

(54) ELECTRICAL CONNECTOR ASSEMBLY WITH PICK UP CAP

(75) Inventors: Fang-Jwu Liao, Tu-chen (TW); Ming-Lun Szu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/973,887

(22) Filed: Oct. 25, 2004

(65) Prior Publication Data

US 2005/0090134 A1    Apr. 28, 2005

(30) Foreign Application Priority Data

Oct. 28, 2003  (TW) .............................. 92219099 U

(51) Int. Cl.
*H01R 13/44*    (2006.01)

(52) U.S. Cl. ....................... 439/135; 439/206

(58) Field of Classification Search ................ 439/135, 439/206, 940
See application file for complete search history.

(56) References Cited

U.S. PATENT DOCUMENTS

| 5,447,445 | A  | * | 9/1995  | Torii et al. .................. 439/271 |
| 5,688,133 | A  | * | 11/1997 | Ikesugi et al. ............... 439/135 |
| 5,769,648 | A  | * | 6/1998  | Hayashi ....................... 439/206 |
| 6,533,592 | B1 | * | 3/2003  | Chen et al. .................. 439/135 |
| 6,554,625 | B1 | * | 4/2003  | Liao et al. ................... 439/135 |
| 6,561,825 | B1 | * | 5/2003  | McHugh et al. ............. 439/135 |
| 6,572,383 | B1 | * | 6/2003  | Yu ................................ 439/41 |
| 6,626,691 | B1 | * | 9/2003  | Yu ............................... 439/342 |

* cited by examiner

*Primary Examiner*—Thanh-Tam Le
(74) *Attorney, Agent, or Firm*—Wei Te Chung

(57) ABSTRACT

An electrical connector assembly (1) includes an LGA connector (2) and a pick up cap (3) mounted onto the connector. The connector defines a number of cells (26) for receiving a corresponding number of contacts (22). The pick up cap has a planar body (31) forming a plane top surface (300) and a bottom surface (301) opposite to the top surface. Several vents (34) each extend zigzag from the top surface to the bottom surface. Each vent forms an upper chamber (341) and a lower chamber (342) communicating and displacing with each other in a manner, such that the upper and lower chambers do not overlap in a direction perpendicular to the top surface. The vents can prevent the contacts from any dirty material and heated air can flow quickly through the vents and the cells to a bottom portion of the connector during curing adhesive film at high temperature.

18 Claims, 4 Drawing Sheets ically connecting with a plurality of metal contact pads formed on the PCB. The pick up cap 9 has a planar body 91

ELECTRICAL CONNECTOR ASSEMBLY WITH PICK UP CAP

BACKGROUND OF THE INVENTION

1. Field of the Invention

The invention is related to an electrical connector assembly which comprised an electrical connector and a pick up cap, the pick up cap being mounted to the connector for providing a flat top surface to be engaged by a vacuum suction device, whereby the connector can be moved onto a circuit substrate such as a printed circuit board (PCB) on which the connector is to be mounted.

2. Description of the Prior Art

At present, on many production lines of the electrical indirty materialry, electronic components such as electrical connectors are mounted onto circuit substrates such as printed circuit boards (PCBs) by surface mount technology (SMT), as disclosed in U.S. Pat. Nos. 5,615,477 and 4,916,805.

A method of mounting an electrical connector onto a PCB by SMT generally comprises a sequence of the following steps A through F:

A—Application of an adhesive film on the PCB having a plurality of metal contact pads. The application of the adhesive film may be performed by screen printing, pin transfer, or from a dispenser onto predetermined areas of the PCB.

B—Activation of the adhesive film by irradiation with actinic light in the ultraviolet (UV) or visible wavelength ranges between 200 and 600 nm, to a degree and for a period of time such that a desired initial tackiness is produced.

C—Mounting the connector with its contacts on the activated adhesive film and the metal contact pads of the PCB.

D—Curing the adhesive film at a temperature between 60~140° C.; for example, in a convection cabinet, using infrared radiant heaters or by means of the actinic radiation source used in step B if such source also produces infrared radiation.

E—Producing electrical engagement between the contacts of the connector and the corresponding metal contact pads of the PCB by soldering in a wave solder machine or in drag soldering equipment;

F—Cooling the assembly to room temperature.

In step C, the connector is accurately positioned on the PCB by a vacuum suction device. Generally, a typical connector has a multiplicity of holes in a flat top portion thereof. Thus the connector does not have a suitably smooth, integral top surface for engagement by a vacuum suction device. Typically, a pick up cap is attached on the top portion of the connector to provide the required plane top surface, as disclosed in U.S. Pat. No. 6,478,588.

Referring to FIG. 6, there is shown an assembled and isometric view of a conventional electrical connector 8 and a convention pick up cap 9 mounted onto the connector 8. The connector 8 comprises a frame 81, an insulative housing 84 received in the frame 81, a load plate 82 mounted on an end of the frame 81, and an operation member 83 mounted on an opposite end of the frame 81 and capable of engaging with the load plate 82. The housing 84 defines a number of cells (not shown) therethrough, the cells receiving a corresponding number of electrical contacts (not shown). The contacts are soldered onto a PCB (not shown) with electrically connecting with a plurality of metal contact pads formed on the PCB. The pick up cap 9 has a planar body 91 with an integrated smooth top surface and four latches 92 extending downwardly from the planar body 91. The latches 92 clasp edges of the load plate 82 of the connector 8 to mount the pick up cap 9 onto the connector 8. A vacuum suction device (not shown) can engage the top surface of the pick up cap 9 to move the whole assembly to a desired location on the PCB. Then the connector 8 can be heated and soldered onto the PCB.

However, the pick up cap 9, the frame 81 and the load plate 82 cover the housing 84. When curing the adhesive film at a high temperature in a convection cabinet using infrared radiant heaters, heated air can only flow through a gap between the pick up cap 9 and the connector 8, the cells of the housing 84 to a bottom portion of the housing 84. Generally, the time needed for curing the adhesive film is short. Thus, the adhesive film is liable to cure non-uniformly. When this happens, electrical engagement between some of the contacts and the corresponding metal contact pads of the PCB may be flawed. The connector 8 may not reliably electrically connect with the PCB. Additionally, when cooling the entire assembly to room temperature, heated air can only be dissipated out through the gap between the pick up cap 9 and the connector 8. This increases the time needed for cooling the assembly, which reduces the efficiency of mounting of the connector 8 onto the PCB.

Referring to FIG. 7, for settling the above-mentioned problems, another pick up cap 6 is provided. The pick up cap 6 has four generally rectangular vents 60 extending through the planar body 61 in a vertical direction thereof. When curing the adhesive film at high temperature in a convection cabinet using infrared radiant heaters, heated air can flow through the vents 60 and get to a bottom of the connector 8 quickly. Therefore, the connector 8 can be reliably electrically soldered onto the PCB in a short time, and the efficiency of mounting of the connector 8 onto the PCB is improved. However, a new problem appears because of the vents 60 in the pick up cap 6. Dirty material is liable to adhere to the contacts of the connector 8 through the vents 60, which effects performance of the contacts.

In view of the above, a new pick up cap that overcomes the above-mentioned disadvantages is desired.

SUMMARY OF THE INVENTION

An object of the invention is to provide an electrical connector assembly comprising an electrical connector having a number of electrical contacts and a pick up cap, wherein the pick up cap facilitates soldering the connector onto a printed circuit board (PCB) reliably and preventing the contacts from side-effect by outside small dirty material.

To achieve the above-mentioned object, an electrical connector assembly in accordance with a preferred embodiment of the present invention is provide. The connector assembly comprises a land grid array (LGA) connector and a pick up cap mounted on the connector. The connector defines a number of cells for receiving a corresponding number of contacts. The pick up cap has a planar body forming a plane top surface, which can be sucked by a vacuum suction device to move the connector assembly to a desired location on a PCB, and a bottom surface opposite to the top surface. Several vents are defined in and through the planar body. Each vent extends zigzag from the top surface to the bottom surface, thereby forming an upper chamber and a lower chamber communicating with the upper chamber. The upper chamber displaces with the lower chamber in a manner, such that the upper and lower chambers do not overlap in a direction perpendicular to the top surface to prevent the contacts from any dirty material. During curing adhesive film at high temperature, heated air can flow quickly through the vents and the cells to a bottom portion of the connector and reliable electrical connection between the contacts and the PCB is subsequently produced.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the invention in detail.

Figure 1:
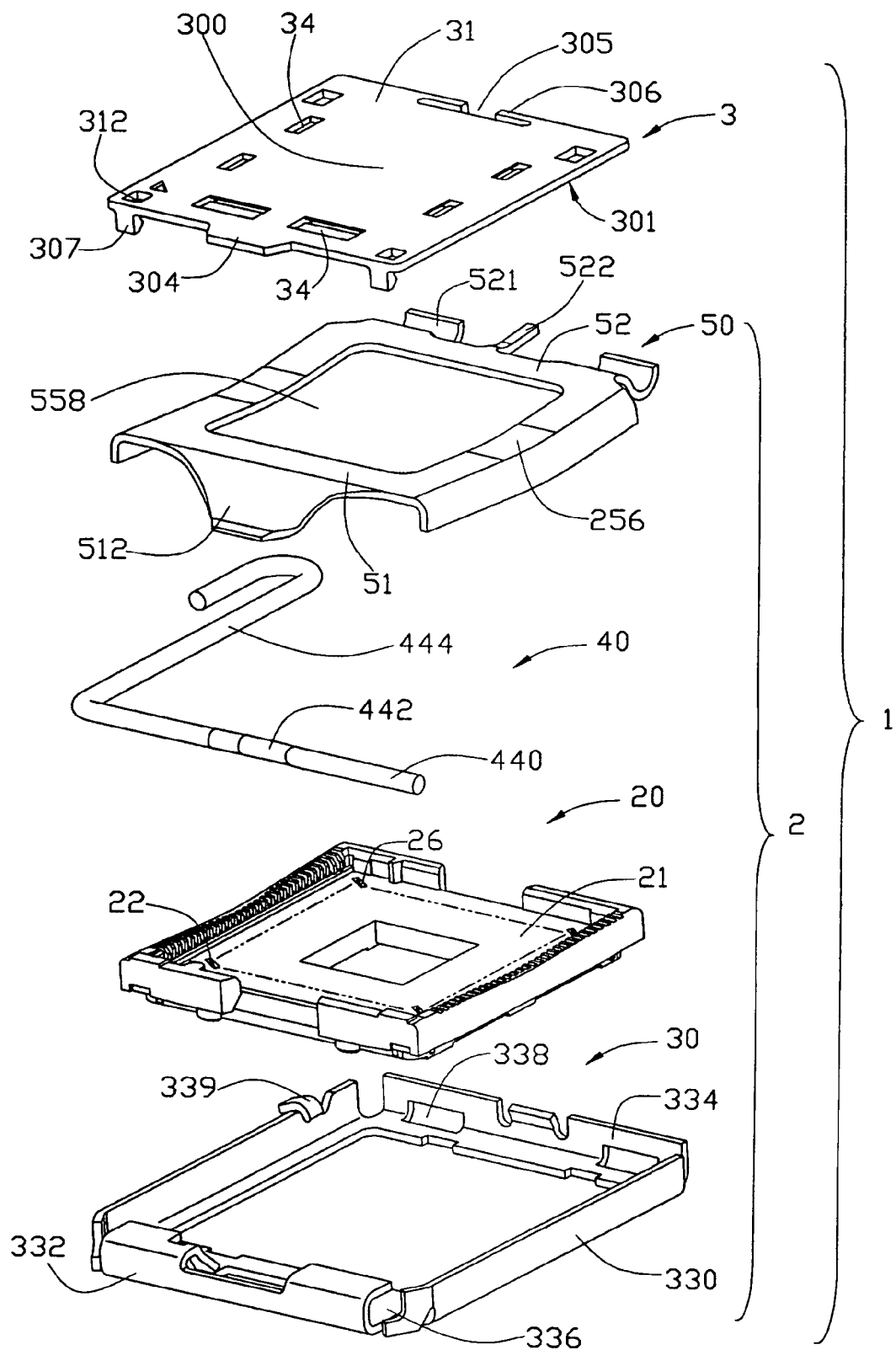
FIG. 1 is an exploded, isometric view of an electrical connector assembly in accordance with the preferred embodiment of the present invention, wherein the connector assembly comprises a land grid array (LGA) connector and a pick up cap.

FIG. 1 is an exploded, isometric view of an electrical connector assembly 1 in accordance with the preferred embodiment of the present invention. The connector assembly 1 comprises a land grid array (LGA) connector 2 and a generally rectangular pick up cap 3. The pick up cap 3 is mounted onto the connector 2, for providing a plane top surface to be engaged by a vacuum suction device (not shown). The connector assembly 1 can thereby be moved onto a circuit substrate, such as a printed circuit board (PCB) (not shown), on which the connector 2 is to be mounted.

The connector 2 comprises a generally rectangular insulative housing 20, a plurality of electrical contacts 22 received in the housing 20, a frame 30 partly covering and reinforcing the housing 20, an operation member 40 pivotably received in an end of the frame 30, and a load plate 50 pivotably mounted to an opposite end of the frame 30 for engaging with the operation member 40.

The housing 20 defines a generally rectangular cavity 21 in a middle thereof. The cavity 21 is used for receiving an electronic package such as an LGA central processing unit (CPU) (not shown) therein. A multiplicity of cells 26 is defined in a portion of the housing 20 under the cavity 21, the cells 26 receiving a corresponding number of the contacts 22 therein respectively. The frame 30 comprises a pair of lateral sides 330 each having an L-shaped cross-section, a front end 332 having a U-shaped cross-section, and a rear end 334 having an L-shaped cross-section. The housing 20 is fittingly received in the frame 30. An elongate hollow 336 is defined in the front end 332 of the frame 30. A pair of spaced slots 338 is defined in the rear end 334 of the frame 30. An ear 339 extends arcuately from an edge of one of the lateral sides 330 of the frame 30.

The operation member 40 comprises a pair of locating portions 440 pivotably received in the hollow 336 of the frame 30, an offset actuating portion 442 between the locating portions 440, and an operating portion 444 extending perpendicularly from an end of one of the locating portions 440. The operating portion 444 is disposed outside of the frame 30. When oriented at a horizontal position parallel to a top face of the housing 20, the operating portion 444 engages with the ear 339.

The load plate 50 comprises a pair of parallel arcuate sides 256. A generally rectangular window 558 is defined in a middle of the load plate 50. An engaging portion 512 extends arcuately from a front end 51 of the load plate 50. A pair of spaced securing portions 521 extends arcuately from an opposite rear end 52 of the load plate 50, the securing portions 521 being pivotably received in the slots 338 of the frame 30. A tail 522 extends from the rear end of the load plate 50, between the securing portions 521. When the load plate 50 is oriented at a horizontal position parallel to the top face of the housing 20, the engaging portion 512 of the load plate 50 is engaged by the actuating portion 442 of the operation member 40, with the load plate 50 thereby pressing the CPU on the contacts 22. When the load plate 50 is oriented at a position perpendicular to the top face of the housing 20, the tail 522 abuts against the frame 30 to prevent the load plate 50 from over-rotating.

The pick up cap 3 has a generally rectangular planar body 31. The planar body 31 comprises a plane top surface 300, and a bottom surface 301 opposite to the top surface 300. Third pairs of vents 34 are defined in the planar body 31. Two pairs of the vents 34 are defined in two opposite sides of the planar body 31 respectively. One pair of the vents 34, each of which is larger than each of the vents 34 defined in the sides of the planar body 31, is defined in the front end of the planar body 31. A trapezoidal lip 304 is formed at a middle of the front end of the planar body 31. A generally T-shaped channel 305 is defined in a middle of the rear end of the planar body 31, thereby forming a pair of opposing arms 306.

Figure 2:
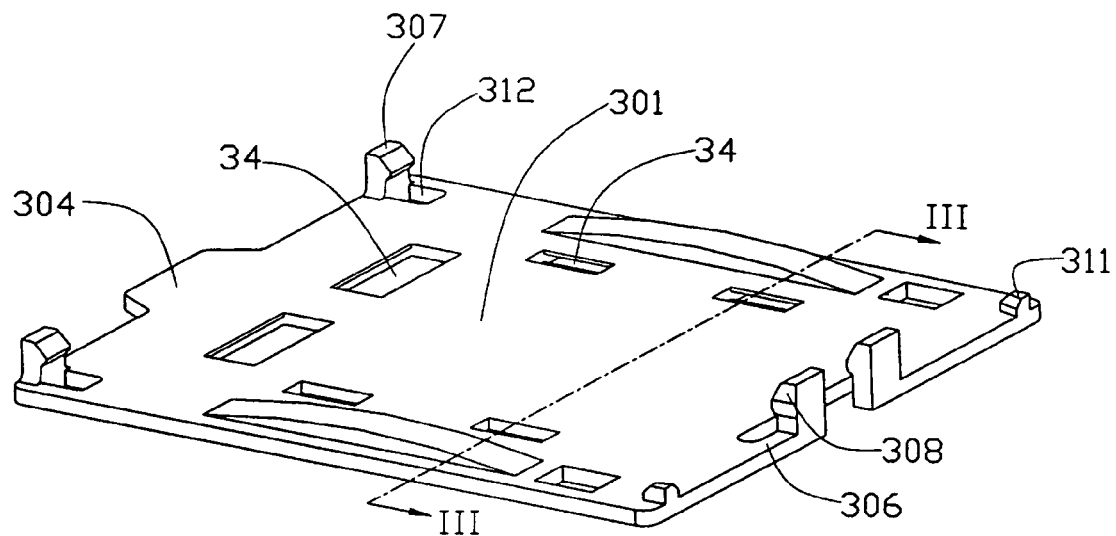
FIG. 2 is an isometric view of the pick up cap of FIG. 1, showing the pick up cap inverted.

FIG. 2 is an isometric view of the pick up cap 3 inverted. A pair of first latches 307 is formed at opposite sides of the front end of the planar body 31 respectively. The first latches 307 depend from the bottom surface 301 of the planar body 31. A through opening 312 is defined in a portion of the planar body 31 adjacent a rear of each first latch 307, thereby increasing a resilience of the first latch 307. A pair of second latches 308 is formed at the rear end of the planar body 31. The second latches 308 depend from free ends of the arms 306 respectively. A pair of protrusions 311 is formed at opposite sides of the rear end of the planar body 31 respectively. The protrusions 311 depend from the bottom surface 301, near corresponding corners of the planar body 31.

Figure 3:
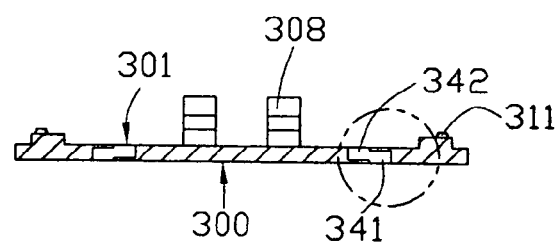
FIG. 3 is a cross-sectional view taken along III—III line of FIG. 2.
Figure 4:
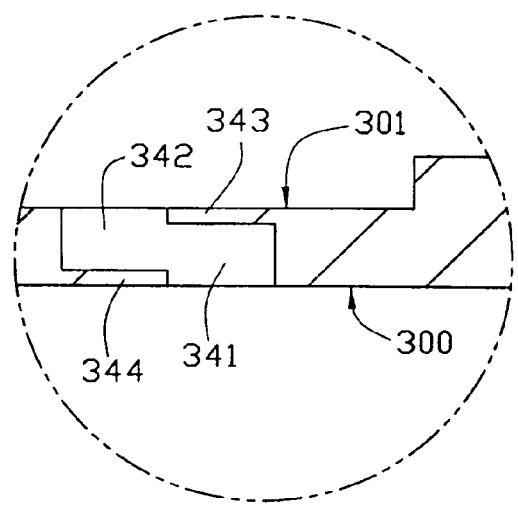
FIG. 4 is an enlarged view of a circled portion IV of FIG. 3.

Referring to FIGS. 3 and 4, each of the vents 34 extends zigzag from the top surface 300 to the bottom surface 301, thereby forming an upper chamber 341 and a lower chamber 342 communicating with the upper chamber 341. The upper chamber 341 extends from the top surface 300 and a first step 343 is formed under the upper chamber 341. The lower chamber 342 extends from the bottom surface 301 and a second step 344 is formed over the lower chamber 342. The upper chamber 341 displaces with the lower chamber 342 in a manner, such that the upper and lower chambers 341, 342 do not overlap in a direction perpendicular to the top surface 300. Therefore, any dirty material can only fall onto the first step 343 and is unlikely to go through the lower chamber 342.

Figure 5:
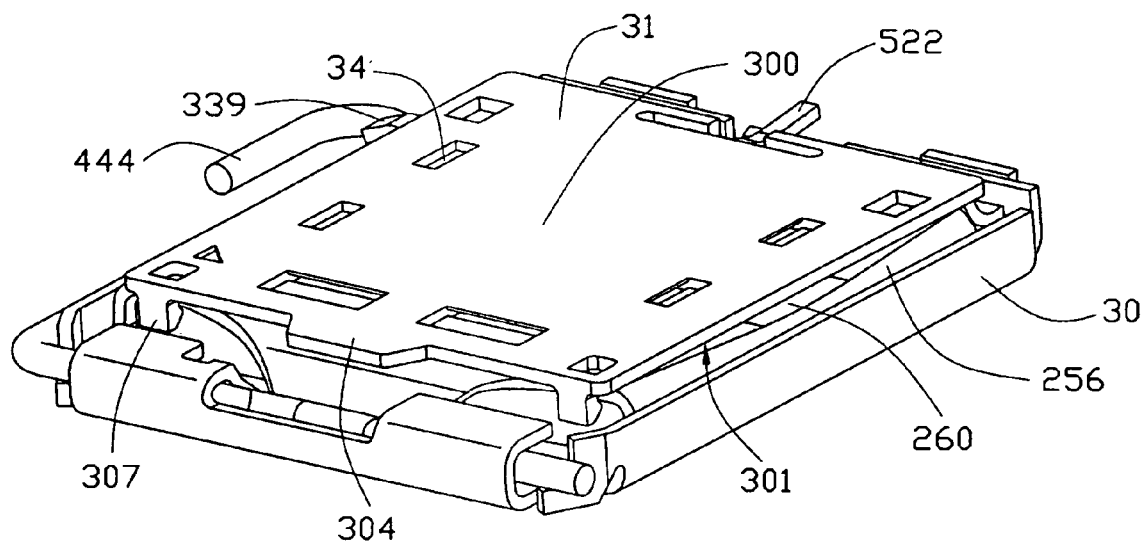
FIG. 5 is an assembled, isometric view of the connector assembly of FIG. 1.
Figure 6:
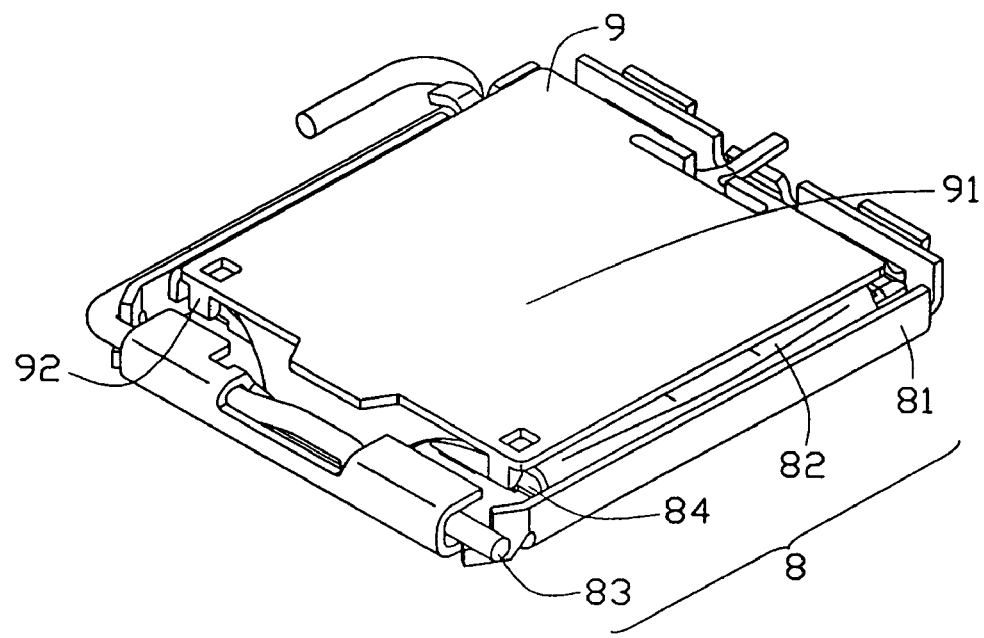
FIG. 6 is an assembled, isometric view of a conventional electrical connector and a conventional pick up cap.
Figure 7:
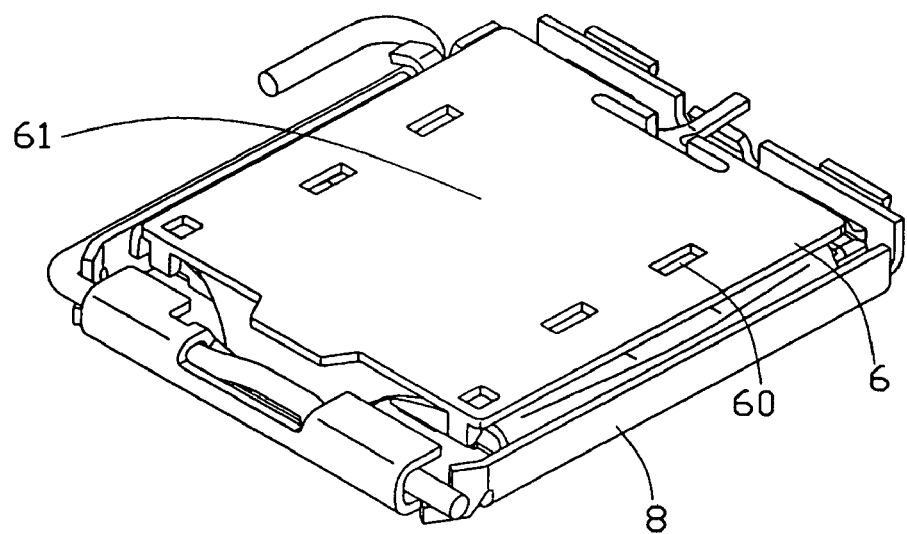
FIG. 7 is an assembled, isometric view of the connector of FIG. 6 and another conventional pick up cap.

Referring to FIG. 5, in attachment of the pick up cap 3 onto the connector 2, the pick up cap 3 is disposed over the connector 2, with the first and second latches 307, 308 loosely contacting corresponding front and rear edges of the load plate 50 respectively. The pick up cap 3 is pressed down. The first latches 307 and second latches 308 are elastically deflected outwardly, and snappingly clasp the front and rear edges of the load plate 50. Simultaneously, the protrusions 311 abut against the rear edge of the load plate 50. The pick up cap 3 is thereby securely mounted onto the connector 2. The channel 305 receives the tail 522 of the load plate 50. A gap 260 is defined between the bottom surface 301 of the pick up cap 3 and the arcuate sides 256 of the load plate 50. The vents 34 are in communication with the window 558 of the load plate 50 and the cells 26 of the housing 20. In this position, a vacuum suction device (not shown) can reliably engage a middle portion of the top surface 300 of the pick up cap 3. The connector assembly 1 can thus be moved to a desired location on the PCB, with the contacts 22 of the connector 2 engaging on an activated adhesive film and metal contact pads of the PCB.

The adhesive film is cured at a high temperature in a convection cabinet using infrared radiant heaters. Heated air can flow not only through the gap 260, but also through the vents 34 of the pick up cap 3, the window 558 of the load plate 50, and the cells 212 of the housing 20. Thus much heated air can quickly flow to a bottom portion of the connector 2, and quickly and uniformly cure the adhesive film without any dirty material adhering to the contacts 22. Accordingly, when the entire assembly is subsequently processed in a wave solder machine or drag soldering equipment, reliable electrical connection between the contacts 22 of the connector 2 and the metal contact pads of the PCB is produced. Furthermore, when said entire assembly is cooled, heated air can be quickly dissipated out through the vents of the pick up cap 3. That is, said entire assembly can be quickly cooled. The efficiency of mounting of the connector 2 onto the PCB is thereby enhanced.

In the above-described embodiment, three pairs of vents 34 extend zigzag through the planar body 31 of the pick up cap 3. It should be understood that the numbers, shapes, sizes and locations of the vents 34 may be varied, as long as each of the vents 34 extends aslant from the top surface 300 to the bottom surface 301 of planar body 31. For example, each of the vents 34 may be triangular, trapezoidal or circular. Additionally, the vents 34 may have different shapes from each other. Furthermore, two or all of the vents 34 may have the same size. The numbers, shapes, sizes and locations of the vents 34 can be configured according to the requirements of each particular application.

From the foregoing it will be recognized that the principles of the invention may be employed in various arrangements to obtain the features, advantages and benefits described above. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed is:

1. An electrical connector assembly comprising:
    an electrical connector adapted for being mounted onto a circuit substrate by surface mount technology (SMT), the connector comprising:
    an insulative housing defining a plurality of cells;
    a plurality of electrical contacts received in corresponding cells respectively;
    a pick up cap engagingly mounted to a top portion of the connector, the pick up cap having a planar body, the planar body having a plane top surface capable of being engaged by a vacuum suction device and a bottom surface, and at least one vent defined in and through the planar body, said at least one vent extending zigzag from the top surface to the bottom surface thereby permitting heated air to flow therethrough during mounting the connector assembly onto the circuit substrate by SMT while preventing the contacts from dirty material.

2. The electrical connector assembly as claimed in claim 1, wherein two pairs of vents are arranged in two opposite sides of the planar body respectively and a pair of vents is arranged in a front end of the planar body.

3. The electrical connector assembly as claimed in claim 1, wherein the connector includes a load plate having a generally rectangular window in a middle thereof.

4. The electrical connector assembly as claimed in claim 3, wherein a pair of latches is formed at opposite sides of a front end of the pick up cap, the latches depending from the bottom surface and snappingly clasping a corresponding edge of the load plate of the connector.

5. The electrical connector assembly as claimed in claim 4, wherein a through opening is defined in a portion of the pick up cap adjacent a rear of each latch.

6. The electrical connector assembly as claimed in claim 3, wherein a T-shaped channel is defined in a middle of a rear end of the pick up cap, thereby forming a pair of opposing arms.

7. The electrical connector assembly as claimed in claim 6, wherein a pair of latches is formed at the rear end of the pick up cap, the latches depending from free ends of the arms respectively and snappingly clasping a corresponding edge of the clip of the connector.

8. The electrical connector assembly as claimed in claim 3, wherein a pair of protrusions is formed at opposite sides of a rear end of the pick up cap respectively, the protrusions depending from the bottom surface and abutting against a corresponding edge of the clip.

9. The electrical connector assembly as claimed in claim 3, wherein when the pick up cap is mounted on the top portion of the connector, said at least one vent is in communication with the window of the load plate and the cells of the housing.

10. The electrical connector assembly as claimed in claim 1, wherein said vent further comprises a first inlet and a second outlet thereof, the first inlet and the second outlet are substantially offset in a vertical direction.

11. The electrical connector assembly as claimed in claim 1, wherein said vent is formed in and through the planar body at least prior to the mounting of the pick-up cap onto the connector.

12. A pick up cap mounted onto an electrical connector for providing a plane surface to be engaged by a vacuum suction device, the pick up cap comprising:
    a planar body comprising a bottom surface opposite to the plane surface, at least one vent defined in and through the planar body, said at least one vent forming a first chamber extending from the plane surface and a second chamber extending from the bottom surface and communicating with the first chamber;

wherein the first chamber and the second chamber have a first inlet and a second outlet respectively, the first inlet and the second outlet are substantially offset in a vertical direction to thereby prevent the connector from being attached to adhesive material while still allowing air flow to pass therethrough for heat dissipation.

13. The pick up cap as claimed in claim 12, wherein two pairs of vents are arranged in two opposite sides of the planar body and a pair of vents is arranged in a front end of the planar body.

14. The pick up cap as claimed in claim 13, wherein each of the vents defined in the front end is larger than each of the vents defined in the sides of the planar body.

15. The pick up cap as claimed in claim 12, wherein said vent is formed in and through the planar body at least prior to the mounting of the pick-up cap onto the connector.

16. The pick up cap as claimed in claim 12, further comprising a plurality of latches formed at sides of the planar body, the latches capable of catching the connector to mount the pick up cap on the connector.

17. An electrical connector assembly comprising:
   an electrical connector for surface mounting to a printed circuit board, said electrical connector including:
   an insulative housing;
   a plurality of contacts disposed in the housing with tips vertically exposed to an exterior outside of an upper face of the housing when said connector individually stands;
   a pick-up cap mounted upon the connector and including a planar body to cover the housing and said tips, said planar body defining opposite upper and lower surfaces; and
   a vent essentially extending through said planar body at least prior to the mounting of the pick-up cap onto the connector; wherein
   said vent extends in a non-linear manner between said upper and lower surfaces so as not to directly expose said tips to the exterior in a vertical direction while still allowing air flow to pass therethrough for heat dissipation during surface mounting of the connector to the printed circuit board.

18. The electrical connector assembly as claimed in claim 17, wherein said vent further comprises a first inlet and a second outlet thereof, the first inlet and the second outlet are substantially offset in a vertical direction.

* * * * *